United States Patent [19]

Cini et al.

[11] Patent Number: 4,672,326

[45] Date of Patent: Jun. 9, 1987

[54] LIMITED OUTPUT OPERATIONAL AMPLIFIER

[75] Inventors: Carlo Cini, Cornaredo; Claudio Diazzi; Pietro Erratico, both of Milan, all of Italy

[73] Assignee: GS Microelettronica S.p.A., Catania, Italy

[21] Appl. No.: 821,926

[22] Filed: Jan. 24, 1986

[30] Foreign Application Priority Data

Jan. 31, 1985 [IT] Italy .................. 19312 A/85

[51] Int. Cl.[4] ........................................... H03F 3/45
[52] U.S. Cl. ................................... 330/254; 307/557; 307/562; 330/260
[58] Field of Search ............... 330/51, 69, 207 P, 254, 330/298, 260; 307/557, 562, 567

[56] References Cited

U.S. PATENT DOCUMENTS 4,355,341 10/1982 Kaplan ..................... 330/298 X
4,402,029 8/1983 Fujita .................... 330/207 P X
4,481,553 11/1984 Owen et al. .............. 330/298 X

*Primary Examiner*—James B. Mullins
*Attorney, Agent, or Firm*—Guido Modiano; Albert Josif

[57] ABSTRACT

This operational amplifier has an output range comprised between values adjustable as desired and includes a differential input stage and an output gain stage, and two additional differential stages supplied at one input with the output voltage of the operational amplifier and at the other input each with a reference voltage representing either the upper limit or the lower limit of the sought range. The outputs of the two additional differential stages are connected to the input stage of the operational amplifier such as not to interfere with the latter when the output voltage of the operational amplifier is comprised between the range limits and to allow switching off and functional substitution of the input stage for either differential stage when the operational amplifier output is equal to the reference voltage of this differential stage, so as to hold that reference voltage at the operational amplifier output regardless of the signal at the input to the operational amplifier.

5 Claims, 5 Drawing Figures

LIMITED OUTPUT OPERATIONAL AMPLIFIER

BACKGROUND OF THE INVENTION

This invention relates to an operational amplifier.

As is known, operational amplifiers find large-scale application in various branches of electronics thanks to their inherent characteristics, versatility and the possibility of providing characteristics of the output signal which differ according to their configuration and connection with other components.

A typical (inverting) configuration is shown in FIG. 1 where the operational amplifier 1 has at its non-inverting input a voltage $V_L$, its output, at the voltage $V_o$, is fed back to the inverting input of the amplifier 1 through the resistor $R_2$, and the input signal $V_{IN}$ is applied to the same inverting input through the resistor $R_1$. Such an operational amplifier has an approximately linear behavior within a voltage range limited by inherent factors to the operational amplifier itself.

However, it is occasionally desirable to limit the output range between set values to be selected at will.

To attain a limitation of the output range, prior circuits often adopt the solution of arranging, in parallel with the feedback resistor, a pair of antiparallel-connected zener diodes.

Consequently, as long as the output voltage is lower than the zener breakdown voltage, the zeners do not intervene and the operational amplifier behaves normally.

When, on the contrary, the output voltage tends to exceed the breakdown voltage of either zener, this is subjected to breakdown, thereby the feedback network will have a low impedance which reduces the gain and causes an output voltage limitation down to the zener breakdown value.

However, that approach has some disadvantages.

In particular, it is not possible to exactly set the limit voltage or voltages of the output range for two different reasons.

First, when utilizing zeners, the limitation voltages can only have discrete values and cannot be varied continuously according to contingent needs.

Furthermore, the limitation voltages cannot be set accurately due to the spread of the breakdown voltages in the diode manufacture and are not constant, due to their drift with temperature.

While are known circuit solutions tending to reduce the drift of the zener breakdown voltage with temperature, such solutions cannot solvet the first problem, do not allow precise set of the voltage limits and on the other hand, they introduce considerable circuit complexity into the amplifier, with evident disadvantages.

SUMMARY OF THE INVENTION

In view of the situation, the aim of this invention is to provide an operational amplifier which can solve the problems encountered with prior amplifiers, wherein in particular the limit values of the output voltage range can be accurately set without being limited to preset discrete values.

Within the above aim, it is a particular object of this invention to provide an operational amplifier which is simple in conception and readily manufactured using the manufacturing techniques commonly employed in the field.

A not least object of this invention is to provide a said improved operational amplifier which can afford the utmost reliability in operation.

The above aim, and these and other objects to become apparent hereinafter, are achieved by an operational amplifier, according to the invention, having a differential input stage and a gain output stage, characterized in that it comprises at least a second differential stage having a first input connected to the output of said gain stage and a second input set at a reference potential, as well as an output connected to said input stage such that it does not interfere with said input stage when the output of said gain stage is lower in absolute value than said reference potential and it allows said input stage to be removed and replaced with said second differential stage when the output of said gain stage is equal to said reference potential, regardless of the signal present at the input of said input stage.

BRIEF DESCRIPTION OF THE DRAWINGS

Further features and advantages will be more clearly apparent from the following description of a preferred but not exclusive embodiment, shown by way of illustration but not of limitation in the accompanying drawings, where.

DESCRIPTION OF THE PREFERRED EMBODIMENTS

Figure 1:
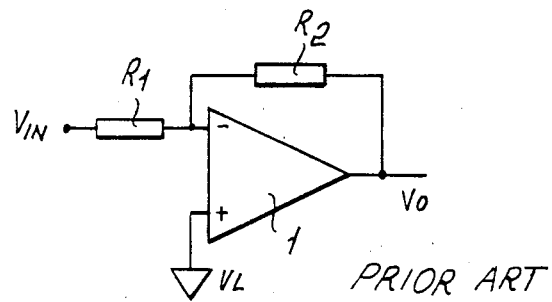
FIG. 1 shows an equivalent electric diagram of a conventional operational amplifier, in the inverting configuration.
Figure 2:
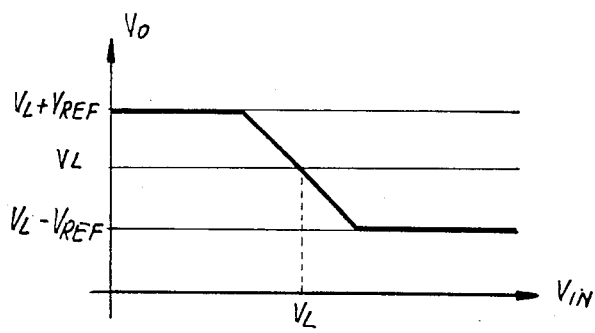
FIG. 2 shows the output voltage versus input voltage obtained with the operational amplifier according to the invention.

FIG. 1 shows a block diagram of the conventional operational amplifier for which a limitation of the output range is desired, for example according to the graph of FIG. 2, wherein the output voltage $V_o$ is limited between the values of $V_L - V_{REF}$ and $V_L + V_{REF}$.

To obtain this behaviour of the output voltage, according to the invention, a conventional operational amplifier stage 1' (shown in FIG. 3 as comprising typically an input differential stage 10 and an output gain stage 11 connected in cascade) has two additional differential stages 12 and 13.

In particular the differential stage 12 has an input connected to a reference potential (e.g. $V_{REF}$) and the other input connected to the output $V_o$ of the output stage 11.

Likewise the differential stage 13 has an input connected to a second reference potential $-V_{REF}$ and the second input connected to the output $V_o$ of the output gain stage 11.

The outputs of the differential stages 12 and 13 are connected to the differential stage 10 of the amplifier and control it so as not to interfere with its operation when the output voltage $V_o$ is within the range defined by the reference voltages (referred to the voltage $V_L$ present at the non-inverting input of the differential stage 10) and to disable and electrically replace the differential stage 10 (supplying to the input to the gain stage 11 the output voltage of the differential stage 12 or 13) as the output voltage $V_o$ reaches the reference voltage $V_{REF}$ or $-V_{REF}$.

Following that replacement therefore the operational amplifier will be comprised of a differential stage (12 or 13) and a gain stage 11 fed back in a total way (in the voltage - follower configuration) which will hold at the output, therefore, the reference voltage applied to that differential stage 12 or 13 which is in operation each time.

Figure 3:
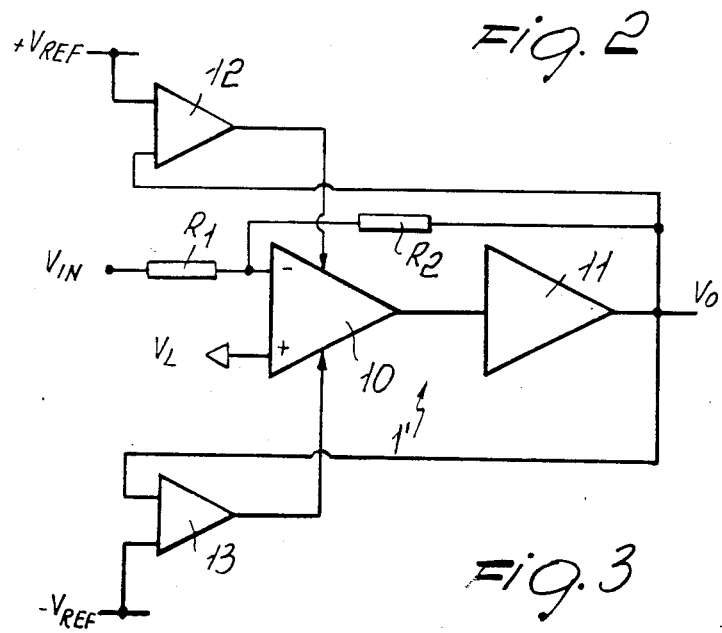
FIG. 3 shows an equivalent block diagram of the operational amplifier according to the invention.
Figure 4:
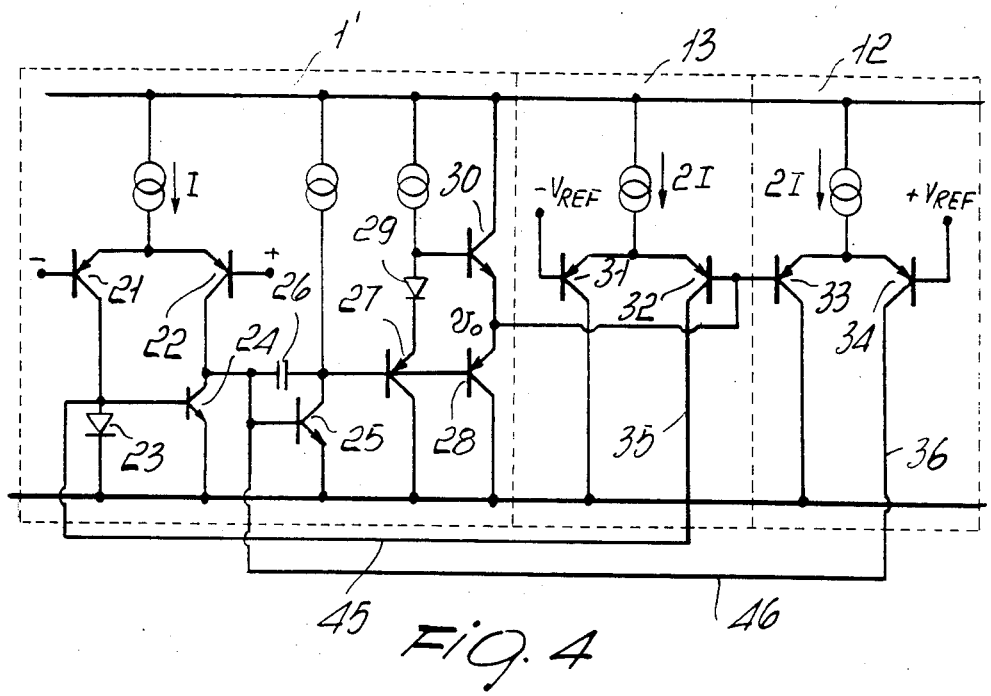
FIG. 4 shows an equivalent electric diagram of the amplifier according to the invention.

Circuit-wise the block diagram of FIG. 3 is implemented as shown in FIG. 4.

In particular, in that figure there have been brought out, encircled by a dash line, the operational amplifier stage 1' and differential stages 12 or 13.

In detail, the operational amplifier stage 1' comprises a pair of transistors 21 and 22 with coupled emitters biased by the current source I.

The base of the transistor 21 represents the inverting input of the OP-amplifier whilst the base of the transistor 22 represents the non-inverting input of the OP-amplifier.

The collector of the amplifier 21 is connected to a diode 23, whilst the collector of the transistor 22 is connected to the collector of a transistor 24 connected at the base to the anode of the diode 23 and at the collector also to a transistor 25 and a capacitor 26.

The operational amplifier is completed by the transistors 27,28 and 30, diode 29, and current sources defining, together with transistor 25, a gain stage connected to the output of the input differential stage.

This arrangement is well known to those skilled in the art and needs no further comment.

As for the differential stages 12 and 13, they are also conventional types and each have a pair of transistors emitter-coupled and biased by current sources 2I.

In particular the transistor 31 of the differential stage 13 has the collector grounded, whilst its base is placed at a first reference potential, in particular $-V_{REF}$.

The first transistor 32 of the pair forming the differential 13 is controlled at the base with the output voltage $V_o$, whilst its collector is connected through line 45 defining a linear link element to the collector of the transistor 21 and the anode of the diode 23 as well as to the base of the transistor 24.

The transistor 33 of the differential stage 12 also has the collector grounded and its base connected to the base of the transistor 32 and to the output of the gain stage and hence of the operational amplifier itself.

The other transistor 34 of the pair forming the differential amplifier 12 has the base placed at a second reference potential $V_{REF}$, whilst its collector is connected through line 45, defining a linear link element, to the collectors of the transistor 22 and the transistor 24 of the stage 1', to the base of the transistor 25 and to the capacitor 26.

Thanks to this connection, so long as the output voltage $V_o$ is within $-V_{REF}$ and $V_{REF}$, the limiter stages, consisting of the differentials 12 and 13, are inactive, since following the existing bias, the transistors 32 and 34 are switched off and the transistors 31 and 33 discharge the bias current supplied by the sources 2I to ground.

Let us assume now that the output voltage approximates the upper limit value of $V_{REF}$.

On reaching the limit voltage, the transistor 34 is also biased forward and begins to conduct, and if the output voltage $V_o$ still increases and reaches 50–60 mV above $V_{REF}$, the transistor 33 switches off and the transistor 34 conducts the bias current 2I through the input differential stage.

In this situation, the differential 12 excludes the input differential and forms itself the control differential for the operational amplifier.

Figure 5:
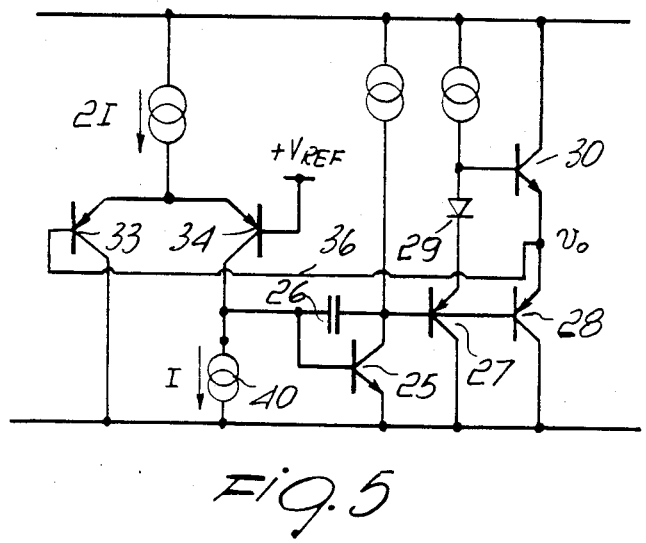
FIG. 5 shows the equivalent electric diagram of the amplifier of FIG. 4 for operating conditions following the output range limitation.

In this phase, the input differential, comprised of the pair of transistors 21 and 22, may be represented by a current source which absorbs a constant current with value I, as is depicted in the equivalent circuit of FIG. 5 where in fact the original input differential stage (formed by transistors 21 and 22) has been replaced with the source 40, and where the differential 13 has been neglected which does not come into action in this phase. Therefore, as visible, between the output of the input differential stage and the input of the gain stage, a summing node is defined, thereby the current supplied by the differential stage 12 is fed to the input differential stage and the gain stage.

Following exclusion and the functional replacement of the input differential stage by the differential 12, the equivalent circuit (as shown in FIG. 5) appears to be that of an operational amplifier wherein the differential stage is composed of the transistors 33 and 34 and which appear to be fed back in a total way with the voltage $V_{REF}$ at the non-inverting input. Consequently, that circuit outputs a constant voltage equal to $V_{REF}$ (as referred to the voltage $V_L$).

A similar behavior occurs if the output voltage $V_o$ decreases down to the value of $-V_{REF}$. In that case in fact the differential, formed of the transistors 21 and 22, is excluded and replaced with the differential 13, to obtain an equivalent circuit equal to that of FIG. 5, with the difference that the reference voltage is equal to $-V_{REF}$, which represents therefore also the constant output voltage.

As may be seen from the foregoing description, the invention fully achieves the objects set forth.

in fact, an operational amplifier has been realized the output range whereof can be limited at will between two values, by suitably selecting the limit values $+V_{REF}, -V_{REF}$.

Of course, the case depicted wherein the two limit values are identical and of opposed signs is but an example, and the upper and lower limits of the output voltage may be asymmetrical with respect to the voltage $V_L$ at the non-inverting input of the operational amplifier.

The operational amplifier according to the invention is, moreover, extremely simple and easily manufactured, in particular may be integrated without difficulty.

The invention herein is susceptible to many modifications and changes, all of which fall within the scope of the inventive concept.

In particular, if only the upper or lower limitation of the output voltage is desired, it will be sufficient to just arrange one limitation differential stage instead of the two shown in the example.

Furthermore, all of the details may be replaced with technical equivalents thereof.

We claim:

1. A limited output operational amplifier, comprising a first differential stage having a first stage input and a first stage output, said first stage input receiving an input signal, a gain stage having a gain stage input and a gain stage output, said gain stage input being connected to said first stage output, a summing node between said first stage output and said gain stage input, at least one range limitation differential stage having first and second limitation stage inputs and a limitation stage output, said first limitation stage input being connected to said gains stage output, said second limitation stage input being connected to a first reference potential, a linear link element having a link element input and a link element output, said link element input being connected to said limitation stage output and said link element output being connected to said summing node, thereby, when said gain stage output is at a voltage in absolute value lower than said first reference potential, said range limitation differential stage is inactive and supplies no signal to said summing node, and, when said gain stage output reaches a voltage equal to said reference potential, said range limitation differential stage is switched on and supplies a control output current to said summing node and forces said gain stage to work at constant current with said gain stage output at said reference potential.

2. A limited output operational amplifier, according to claim 1, comprising a further range limitation differential stage having first and second further stage inputs and a further stage output, said first further stage input being connected to said one limitations stage input and said gain stage output, said second further stage input being connected to a further reference potential, different from said first reference potential, a further linear link element having a further link element input and a further link element output, said further link element input being connected to said further stage output and said further link element output being connected to said summing node, thereby said first and said further reference potential forming lower and upper limits for the output signal of said operational amplifiers.

3. A limited output operational amplifier, comprising a first differential stage including a first and a second transistors having emitter, base and collector electrodes, said emitter electrodes of said first and second transistors being coupled together, said base electrodes of said first and second transistors forming an operational amplifier input, said collector electrode of said second transistor forming a first stage output; a gain stage including active amplifier means and having a gain stage input connected to said first stage output and a gain stage output forming an operational amplifier output; at least one range limitation differential stage including a third and a fourth transistors having emitter, base and collector electrodes, said emitter electrodes of said third and fourth transistors being coupled together, said collector electrode of said third transistor being grounded, said base electrode of said third transistor being connected to a first reference potential, said base electrode of said fourth transistor being connected to said gain stage output, a linear link element having a link element input and a link element output, said link element input being connected to said collector electrode of said fourth transistor and said link element output being connected to said collector electrode of said first transistor.

4. A limited output operational amplifier according to claim 3, further comprising a second range limitation differential stage including a fifth and a sixth transistors having emitter, base and collector electrodes, said emitter electrodes of said fifth and sixth transistors being coupled together, said collector electrode of said fifth transistor being grounded, said base electrode of said fifth transistor being connected to said gain stage output, said base electrode of said sixth transistor being connected to a second reference potential, a further linear link element having a further lin element input and a further linear link output, said further link element input being connected to said collector electrode of said sixth transistor and said further link output being connected to said collector electrode of said second transistor.

5. A limited output operational amplifier, comprising a first differential stage including a first and a second transistors having emitter, base and collector electrodes, said emitter electrodes of said first and second transistors being coupled together, said base electrodes of said first and second transistors forming an operational amplifier input, said collector electrode of said second transistor forming a first stage output: a gain stage including active amplifier means and having a gain stage input connected to said first stage output and a gain stage output forming an operational amplifier output; at least one range limitation differential stage including a third and fourth transistors having emitter, base and collector electrodes, said emitter electrodes of said third and fourth transistors being coupled together, said collector electrode of said third transistor being grounded, said base electrode of said third transistor being connected to said gain stage output, said base electrode of said fourth transistor being connected to a first reference potential, a linear link element having a link element input and a link element output, said link element input being connected to said collector electrode of said fourth transistor and said link element output being connected to said collector electrode of said second transistor.

* * * * *

UNITED STATES PATENT OFFICE
CERTIFICATE OF CORRECTION

Patent No. 4 672 326          Dated JUNE 9, 1987

Inventor(s) CARLO CINI - CLAUDIO DIAZZI-PIETRO ERRATICO

It is certified that error appears in the above-identified patent and that said Letters Patent are hereby corrected as shown below:

On the title page assignee should read
/ 73 /  Assignee: SGS MICROELETTRONICA S.p.A.,
             Catania, Italy --

Signed and Sealed this

Twenty-fourth Day of May, 1988

Attest:

DONALD J. QUIGG

Attesting Officer    Commissioner of Patents and Trademarks